(12) United States Patent
Kang et al.

(10) Patent No.: US 7,265,596 B2
(45) Date of Patent: Sep. 4, 2007

(54) DATA LATCH CIRCUIT OF SEMICONDUCTOR DEVICE

(75) Inventors: Hee-Bok Kang, Kyoungki-do (KR); Jin-Hong Ahn, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 0 days.

(21) Appl. No.: 11/322,765

(22) Filed: Dec. 30, 2005

(65) Prior Publication Data

US 2006/0220718 A1    Oct. 5, 2006

(30) Foreign Application Priority Data

Mar. 31, 2005 (KR) .................... 10-2005-0027389

(51) Int. Cl.
  *H03L 7/00* (2006.01)
  *G11C 7/10* (2006.01)
(52) U.S. Cl. .................... 327/161; 365/189.05
(58) Field of Classification Search ............... None
  See application file for complete search history.

(56) References Cited

U.S. PATENT DOCUMENTS

| 5,659,507 | A | | 8/1997 | Yabe et al. |
| 5,892,532 | A | * | 4/1999 | Katakura et al. ............ 347/240 |
| 6,137,320 | A | * | 10/2000 | Takai ............................ 327/56 |
| 6,157,229 | A | * | 12/2000 | Yoshikawa .................. 327/149 |
| 6,263,463 | B1 | | 7/2001 | Hashimoto |
| 6,526,106 | B1 | * | 2/2003 | Migita ......................... 375/354 |
| 6,639,868 | B2 | | 10/2003 | Kim et al. |
| 6,704,242 | B2 | * | 3/2004 | Kobayashi ............. 365/230.08 |
| 6,999,371 | B2 | * | 2/2006 | Nii .............................. 365/227 |
| 2002/0015352 | A1 | | 2/2002 | Lee |
| 2004/0095340 | A1 | * | 5/2004 | Nakamura ................... 345/204 |
| 2006/0120485 | A1 | * | 6/2006 | Kosaka ....................... 375/318 |

FOREIGN PATENT DOCUMENTS

| JP | 2001-307497 | 11/2001 |
| JP | 2004-214997 | 7/2004 |
| JP | 2004-355667 | 12/2004 |
| KR | 2002-0003019 | 1/2002 |
| KR | 2002-0019626 | 3/2002 |
| KR | 2002-0095686 | 12/2002 |

* cited by examiner

*Primary Examiner*—Cassandra Cox
(74) *Attorney, Agent, or Firm*—Blakely Sokoloff Taylor & Zafman

(57) ABSTRACT

A data latch circuit for latching a data signal in synchronization with a clock signal includes a hold time delay unit for generating a first clock signal by delaying the clock signal for a hold time of the data signal and an inverse first clock signal as a second clock signal; a data input control unit for generating a first data transition detection signal in response to the first clock signal and a first transition timing of the data signal and a second data transition detection signal in response to the second clock signal and a second transition timing of the data signal; and a data latch unit for starting latching the data signal in response to the first data transition detection signal and finishing the latching of the data signal in response to the second data transition detection signal.

27 Claims, 10 Drawing Sheets

DATA LATCH CIRCUIT OF SEMICONDUCTOR DEVICE

FIELD OF INVENTION

The present invention relates to a semiconductor integrated circuit; and, more particularly, to a data latch circuit for latching data.

DESCRIPTION OF PRIOR ART

Generally, a data latch is an integrated circuit for holding a data for a predetermined time. That is, if an inputted data is a low-level data, the data latch holds the low-level data until a new data is inputted and, then, outputs the low-level data if the new data is inputted. Likewise, if the inputted data is a high-level data, the data latch holds the high-level data until a new data is inputted and, then, outputs the high-level data if the new data is inputted.

Meanwhile, there are two different methods for inputting/outputting a data. That is, one is a synchronous method for inputting/outputting a data in synchronization with a falling edge or a rising edge of a clock signal, and the other is an asynchronous method for inputting/outputting a data regardless of the clock signal. Although the two methods have different merits and demerits, the synchronous method is more widely used for a high-speed semiconductor integrated circuit because a data input/output timing can be precisely controlled.

In such a synchronous system, the data latch also receives and outputs a data in synchronization with a falling edge or a rising edge of the clock signal. For a stable operation of the data latch, a data signal should be inputted to the data latch a first predetermined time before a transition of the clock signal, and the input of the data signal should be kept for a second predetermined time after a transition of the clock signal. Herein, the first predetermined time is called a set-up time and the second predetermined time is called a hold time.

Therefore, a data should be inputted to the data latch before the set-up time and the input of the data should be maintained for at least the hold time so that the data latch can stably latch the data.

FIG. 1 is a schematic circuit diagram showing a conventional data latch circuit.

As shown, the conventional data latch circuit includes an input driving unit 50, an input processing unit 30, an amplifying unit 20, a precharge unit 10 and an output latching unit 40.

The input driving unit 50 receives a data signal to divide the received data signal as an input control signal pair S and SB. The input processing unit 30 delivers the data signal to a first and a second nodes LN1 and LN2 respectively in response to the input control signal pair S and SB. The amplifying unit 20 amplifies and latches the data signal delivered to the first and the second nodes LN1 and LN2 in response to the input control signal pair S and SB.

The precharge unit 10 precharges the first and the second nodes LN1 and LN2 in response to a clock signal CLK. The output latching unit 40 receives the amplified and latched data signal from the amplifying unit 20 in order to output the received data signal.

FIG. 2 is a wave diagram depicting an operation of the conventional data latch circuit shown in FIG. 1.

Referring to FIGS. 1 and 2, the operation of the conventional data latch circuit is described below.

Herein, it is assumed that a data signal is latched by the conventional data latch circuit in synchronization with a rising edge of the clock signal CLK.

If an input data signal LAT_IN is inputted to the conventional data latch circuit a set-up time tS before a data latch edge, i.e., a rising edge, of the clock signal CLK and the input of the input data signal LAT_IN is maintained for a hold time tH after the data latch edge, the conventional data latch circuit successfully latches the input data signal LAT_IN and outputs the latched signal as an output data signal LAT_OUT.

That is, if a data input period satisfies the set-up time tS and the hold time tH, a pass condition for stably latching a data can be satisfied. However, it is a fail condition if the data input period does not satisfy the set-up time tS and the hold time tH. Under the fail condition, the conventional data latch circuit cannot latch the data and, thus, an error occurs.

FIG. 3 is a wave diagram illustrating a defect of the conventional data latch circuit.

Referring to FIGS. 1 to 3, the operation and the defect of the conventional data latch circuit are described in detail.

As shown in FIG. 3, the first and the second nodes LN1 and LN2 are precharged as a high level when the clock signal CLK is in a low level. When the clock signal CLK is in a high level, the first and the second nodes LN1 and LN2 store a data signal according to the input control signal pair S and SB inputted to the input processing unit 30.

When a high level data is inputted to the input driving unit 50, the input control signal pair S and SB are respectively at a high level and a low level and are inputted to the input processing unit 30. According to the inputted input control signal pair S and SB, the first node LN1 transitions to a low level and the second node LN2 transitions to a high level, and the amplifying unit 20 helps to accelerate the transition speed.

After the transitions of the first and the second nodes LN1 and LN2 are completed, the output latching unit 40 latches a high level data signal in a latch constituted with inverters IV4 and IV5 and outputs the latched high level data signal as the output data signal LAT_OUT.

Generally, the input data signal LAT_IN has a low frequency and the clock signal CLK has a high frequency. Accordingly, as shown in FIG. 3, during a single data latch operation, the clock signal CLK is continuously clocking and, thus, a charge/discharge operation is continuously performed in each circuit of the amplifying unit 20 and the precharge unit 10.

The first node LN1 is maintained as a low level by the input control signal S which is inputted as a high level and the second node LN2 is maintained as a high level by the input control signal SB which is inputted as a low level, whereby one of the first and the second nodes LN1 and LN2 is continuously charged and discharged while an input of a data signal is kept. In this case, since the input control signal S is in a high level, a metal oxide semiconductor (MOS) transistor Q8 is turned on and, thus, the first node LN1 is continuously charged and discharged according to the clocking of the clock signal CLK.

Subsequently, due to the continuous clocking of the clock signal CLK during the input period of a data signal, the precharge unit 10 and the amplifying unit 20 are continuously operated and, thus, a lot of power is consumed. The dotted circles in FIG. 3 show the charge/discharge current consumption of the precharge unit 10 and the amplifying unit 20 during the input period of a data signal.

If the frequency of the clock signal CLK is higher, the above-mentioned problem becomes more serious. Since the frequency of the clock signal CLK is increased more and more for improving an operational speed of an integrated circuit, the charge/discharge current consumption is also increased and, thus, unnecessary power consumption is increased for latching a data.

Further, according to the conventional data latch circuit shown in FIG. 1, a data signal can be stably latched only when the data signal is inputted to the conventional data latch circuit satisfying the set-up time and the hold time. If the set-up time and the hold time are not precisely satisfied, the data signal cannot be correctly latched because an input timing of the input control signal pair S and SB should be synchronized with a clocking timing of the clock signal CLK. However, since the frequency of the clock signal is increased more and more for improving the operational speed, it is more difficult to synchronize the input timing of the input control signal pair S and SB with a rising edge or a falling edge of the clock signal CLK.

SUMMARY OF INVENTION

It is, therefore, an object of the present invention to provide a data latch circuit for preventing an unnecessary charge/discharge current consumption due to clocking of a clock signal and for stably latching a data even though a set-up time or a hold time is not satisfied.

In accordance with an aspect of the present invention, there is provided a data latch circuit for latching a data signal in synchronization with a clock signal, including a hold time delay unit for generating a first clock signal by delaying the clock signal for a hold time of the data signal and an inverse first clock signal as a second clock signal; a data input control unit for generating a first data transition detection signal in response to the first clock signal and a first transition timing of the data signal and a second data transition detection signal in response to the second clock signal and a second transition timing of the data signal; and a data latch unit for starting latching the data signal in response to the first data transition detection signal and finishing the latching of the data signal in response to the second data transition detection signal.

In accordance with another aspect of the present invention, there is provided a data latch circuit for latching a data signal in synchronization with a clock signal, including: a hold time delay unit for generating a delayed clock signal by delaying the clock signal for a hold time of the data signal; a data input control unit for generating a data input signal by receiving the data signal at an activation period of the delayed clock signal; and a data latch unit for latching a data signal which corresponds to the data input signal.

In accordance with further another aspect of the present invention, there is provided a method for latching a data signal in a semiconductor device, including the steps of: a) generating a delayed clock signal by delaying a clock signal for a hold time; b) starting to latch the data signal at a first transition timing of the data signal while the delayed clock signal is in a first level; and c) finishing the latch of the data signal at a second transition timing of the data signal while the delayed clock signal is in a second level.

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF INVENTION

Hereinafter, a data latch circuit in accordance with the present invention will be described in detail referring to the accompanying drawings.

Figure 1:
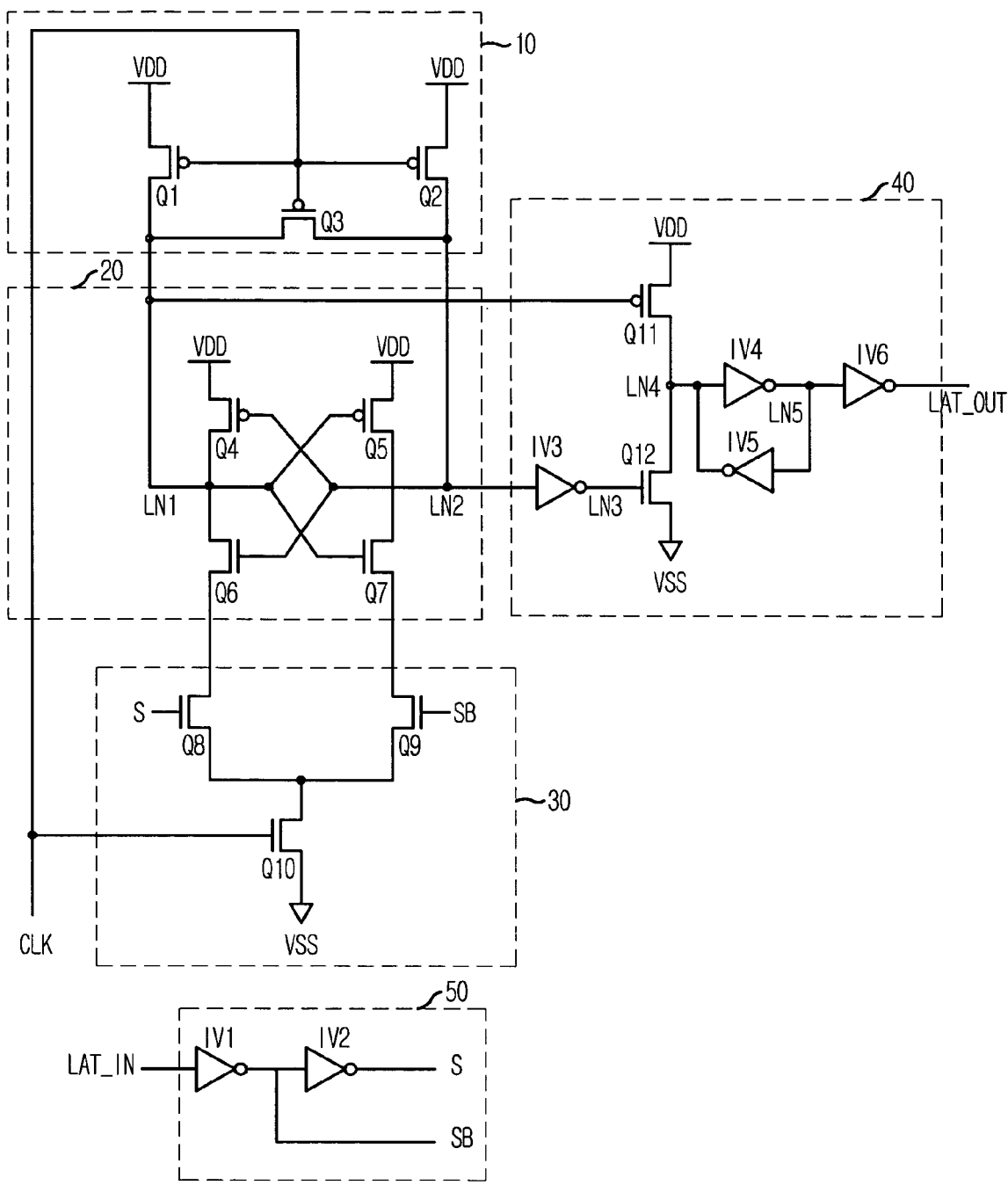
FIG. 1 is a schematic circuit diagram showing a conventional data latch circuit.
Figure 2:
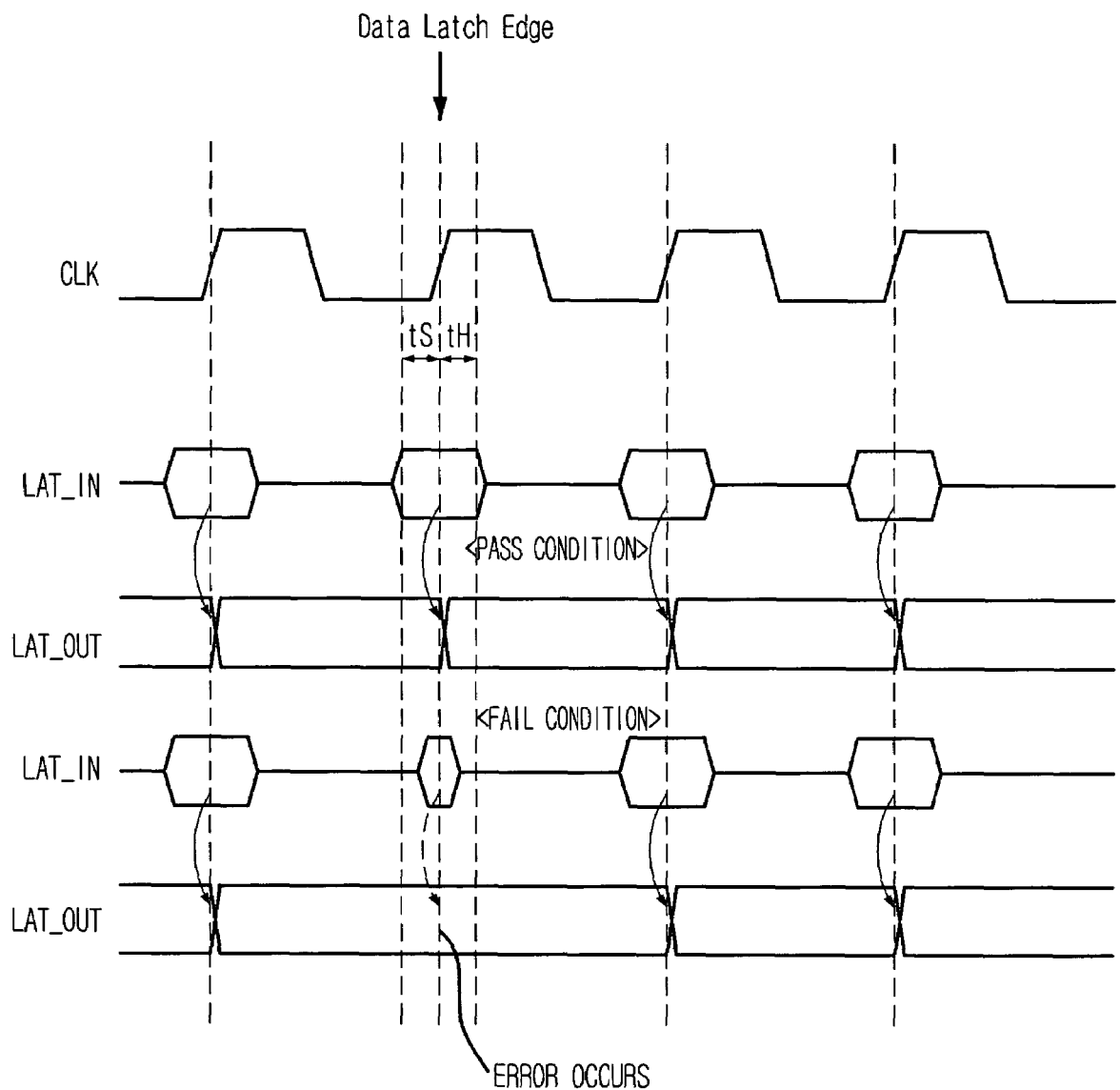
FIG. 2 is a wave diagram depicting an operation of the conventional data latch circuit shown in FIG. 1.
Figure 3:
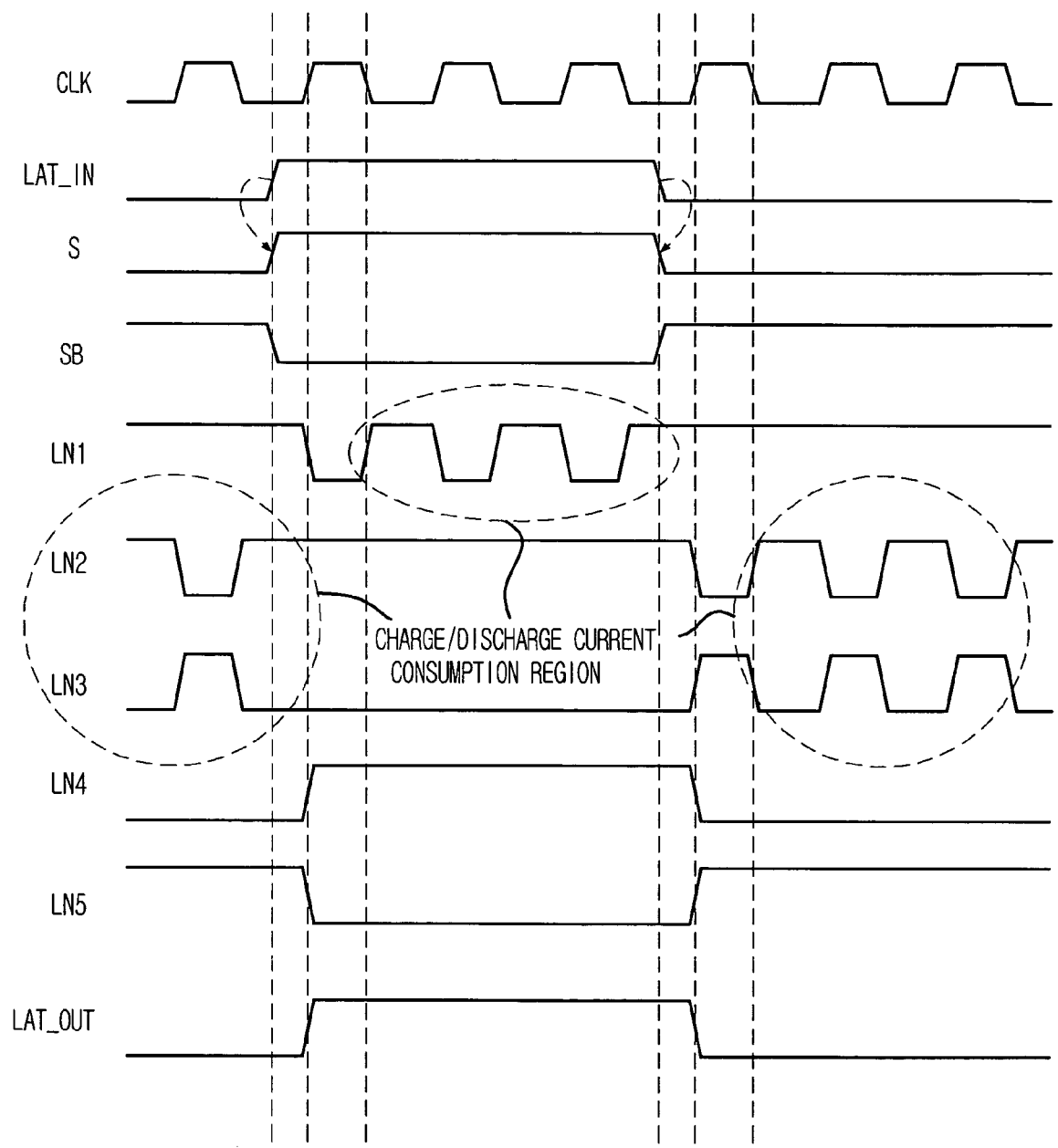
FIG. 3 is a wave diagram illustrating a defect of the conventional data latch circuit.
Figure 4:
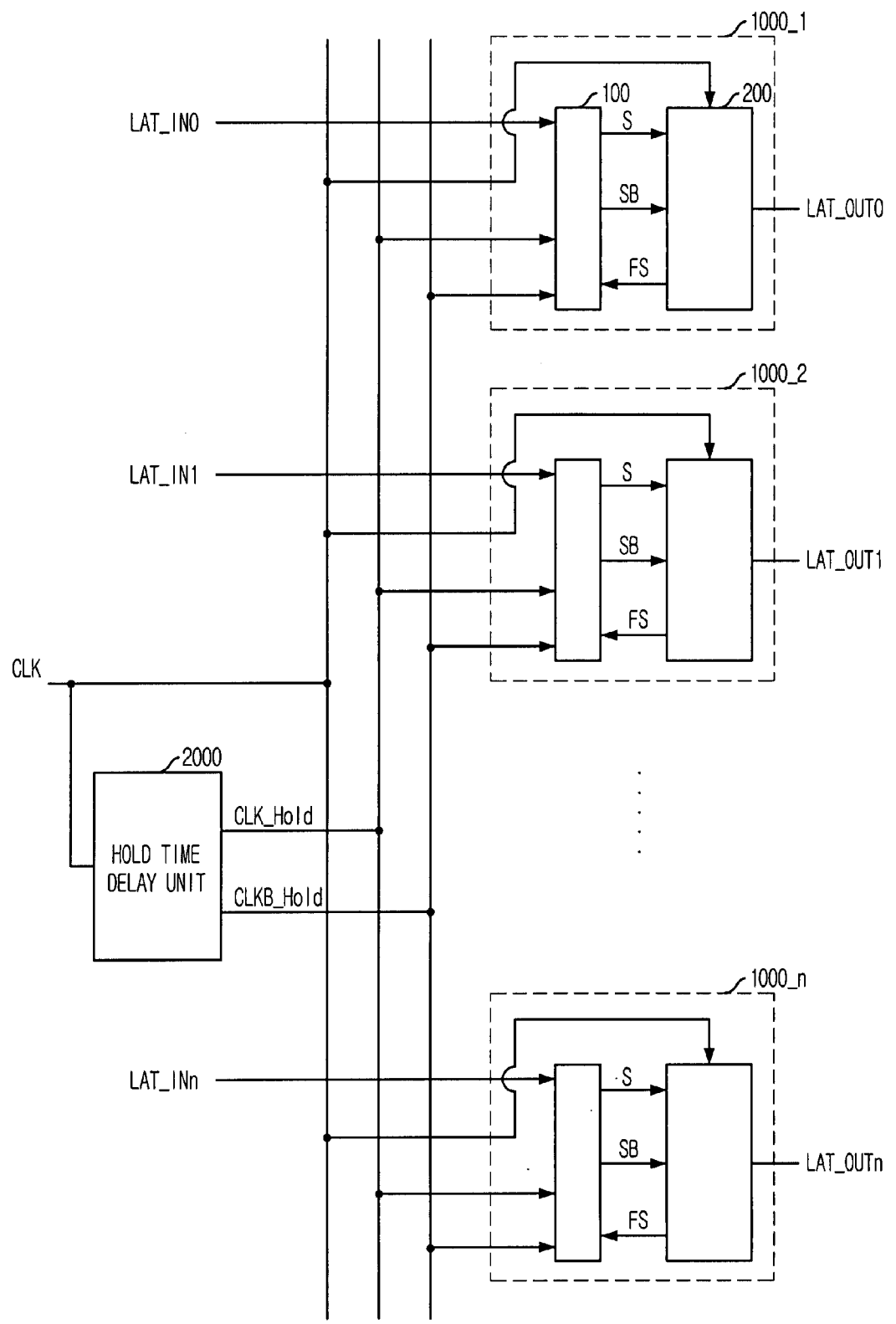
FIG. 4 is a data latch circuit in accordance with a preferred embodiment of the present invention.

FIG. 4 is a data latch circuit in accordance with a preferred embodiment of the present invention.

As shown, the data latch circuit includes a hold time delay unit 2000, a data input control unit 100 and a data latch unit 200.

The hold time delay unit 2000 delays a clock signal CLK for a hold time of a data signal to thereby generate a first clock signal CLK_Hold. The hold time delay unit 2000 also generates a second clock signal CLKB_Hold which is an inverted version of the first clock signal CLK_Hold.

The data input control unit 100 generates a first data transition detection signal S in response to a first transition timing of the first clock signal CLK_Hold and a data signal LAT_IN0 and generates a second data transition detection signal SB in response to a second transition timing of the second clock signal CLKB_Hold and the data signal LAT_IN0.

The data latch unit 200 begins to latch the data signal LAT_IN0 in response to the first data transition detection signal S and finishes latching the data signal LAT_IN0 in response to the second data transition detection signal SB.

Herein, there are two different methods for processing a data: one is processing a single data in series and the other is processing a plurality of data in parallel.

In case of the data latch circuit shown in FIG. 4, a plurality of data are processed in parallel. For this purpose, a plurality of latch units, i.e., 1000_1 to 1000_n, each having the data input control unit 100 and the data latch unit 200, are connected in parallel. Herein, the number of the plurality of latch units is same to the number of the plurality of data to be processed in parallel.

If a single data is latched and outputted in synchronization with a clock signal, a single hold time delay unit and a single latch unit are needed.

Meanwhile, the data latch unit 200 generates a feed-back signal FS for inactivating the first data transition detection signal S in response to the beginning of latching the data signal LAT_IN0 and for inactivating the second data transition detection signal SB in response to the finishing of latching the data signal LAT_IN0. Herein, the first and the second data detection signals S and SB are not fixed. That is, the first data detection signal can be SB and the second data detection signal SB can be S. This is determined by a logic level of an input data.

Figure 5:
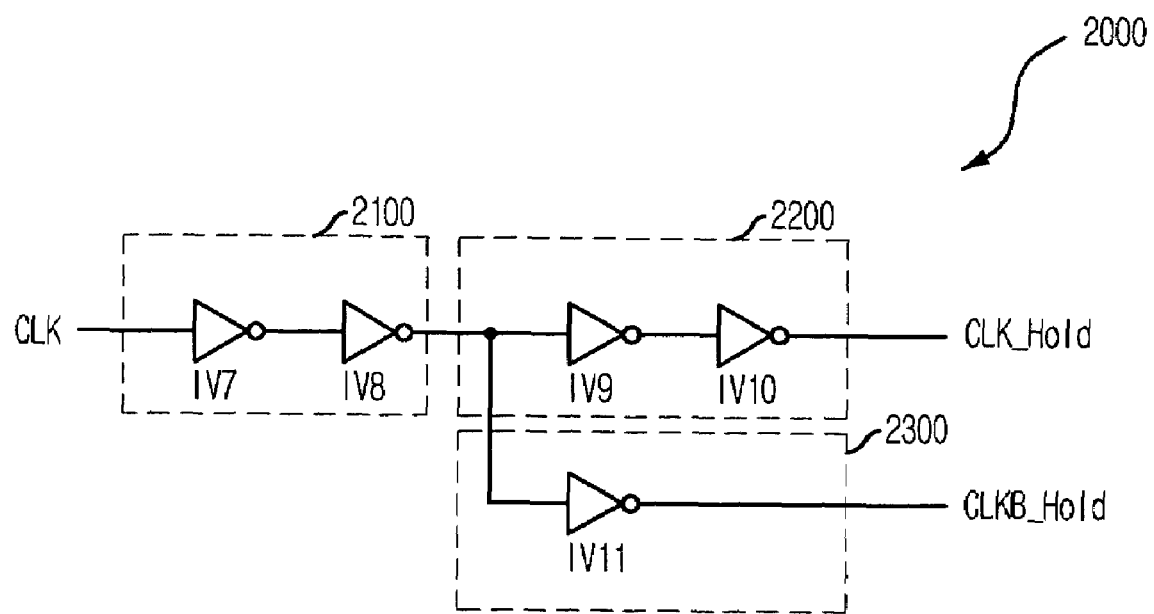
FIG. 5 is a schematic circuit diagram showing the hold time delay unit shown in FIG. 4.

FIG. 5 is a schematic circuit diagram showing the hold time delay unit 2000 shown in FIG. 4.

As shown, the hold time delay unit 2000 includes a delay unit 2100 for delaying the clock signal CLK for the hold time; a buffering unit 2200 for buffering an output of the delay unit 2100 in order to generate the first clock signal CLK_Hold; and an inverting unit 2300 for inverting the output of the delay unit 2100 in order to generate the second clock signal CLKB_Hold.

The delay unit 2100 includes two inverters IV7 and IV8 connected in series and the buffering unit also includes two inverters IV9 and IV10 connected in series. The inverting unit 2300 includes an inverter IV11.

Figure 6:
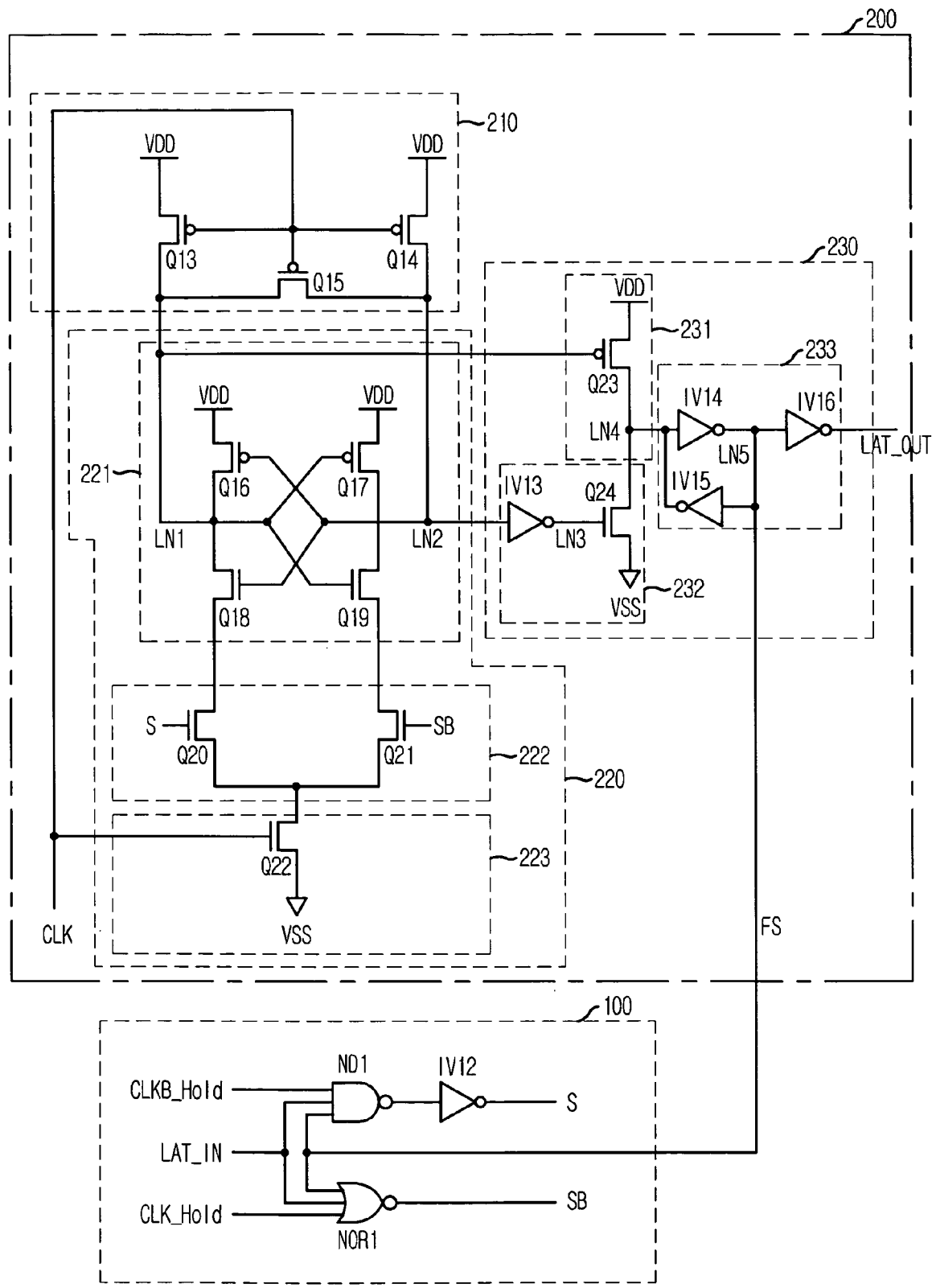
FIG. 6 is a schematic circuit diagram depicting the data input control unit and the data latch unit shown in FIG. 4.

FIG. 6 is a schematic circuit diagram depicting the data input control unit 100 and the data latch unit 200 shown in FIG. 4.

As shown, the data input control unit 100 includes a first logic circuit for performing a logic AND operation to the second clock signal CLKB_Hold, the data signal LAT_IN and the feed-back signal FS in order to generate the first data transition detection signal S; and a second logic circuit for performing a logic NOR operation to the first clock signal CLK_Hold, the data signal LAT_IN and the feed-back signal FS in order to generate the second data transition detection signal SB.

The first logic circuit includes a NAND gate ND1 for performing a logic NAND operation to the second clock signal CLKB_Hold, the data signal LAT_IN and the feed-back signal FS; and a first inverter IV12 for inverting an output of the logic NAND gate in order to generate the first data transition detection signal S. The second logic circuit includes a NOR gate NOR1 for receiving the first clock signal CLK_Hold, the data signal LAT_IN and the feed-back signal FS in order to generate the second data transition detection signal SB.

The data latch unit 200 includes a precharge unit 210 for precharging a first and a second nodes LN1 and LN2 according to the clock signal CLK; a data storing unit 220 for storing the data signal LAT_IN by discharging one of the first and the second nodes LN1 and LN2 in response to the first data transition detection signal S and for resetting the stored data signal LAT_IN by charging the discharged node in response to the second data transition detection signal SB; and a latch output unit 230 for latching and outputting the data signal LAT_IN according to the charge/discharge states of the first and the second nodes LN1 and LN2.

In detail, the precharge unit includes a first MOS transistor Q13 for supplying a power supply voltage VDD to the first node LN1 in response to the clock signal CLK; a second MOS transistor Q14 for supplying the power supply voltage VDD to the second node LN2 in response to the clock signal CLK; and a third MOS transistor Q15 for equalizing voltage levels of the first and the second nodes LN1 and LN2 in response to the clock signal CLK.

The data storing unit 220 includes an amplifying unit 221 for detecting and amplifying the first and the second nodes LN1 and LN2 in a cross-coupled way; a charge/discharge control unit 222 for respectively discharging and charging the first and the second nodes LN1 and LN2 in response to the first data transition detection signal S and for respectively charging and discharging the first and the second nodes LN1 and LN2 in response to the second data transition detection signal SB; and a current delivering unit 223 for sinking a current which is charged/discharged by the charge/discharge control unit 222 in response to the clock signal CLK.

In detail, the amplifying unit 221 includes a fourth MOS transistor Q16 whose gate and one terminal are respectively coupled to the second node LN2 and the power supply voltage VDD; a fifth MOS transistor Q17 whose gate and one terminal are respectively coupled to the first node LN1 and the power supply voltage VDD; a sixth MOS transistor Q18 whose gate and one terminal are respectively coupled to the second node LN2 and the other terminal of the fourth MOS transistor Q16; and a seventh MOS transistor Q19 whose gate and one terminal are respectively coupled to the first node LN1 and the other terminal of the fifth MOS transistor Q17.

The charge/discharge control unit 222 includes an eighth MOS transistor Q20 whose one terminal is coupled to the other terminal of the sixth MOS transistor Q18 for discharging the first node LN1 in response to the first data transition detection signal S; and a ninth MOS transistor Q21 whose one terminal is coupled to the other terminal of the seventh MOS transistor Q19 for discharging the second node LN2 in response to the second data transition detection signal SB.

The current delivering unit 223 includes a tenth MOS transistor Q22 connected between a ground voltage VSS and the other terminals of the eighth and the ninth MOS transistors Q20 and Q21, wherein a gate of the tenth MOS transistor Q22 receives the clock signal CLK.

The latch output unit 230 includes a pull-up unit 231 for pulling-up a third node LN4 according to a state of the first node LN1; a pull-down unit 232 for pulling-down the third node LN4 according to a state of the second node LN2; and a data signal latch 233 for latching and outputting a signal delivered to the third node LN4 and for generating the feed-back signal FS for inactivating the first data transition detection signal S or the second data transition detection signal SB by using the latched signal.

The pull-up unit 231 includes an eleventh MOS transistor Q23 connected between the power supply voltage VDD and the third node LN4, wherein a gate of the eleventh MOS transistor Q23 is coupled to the first node LN1.

The pull-down unit 232 includes a second inverter IV13 for inverting a signal of the second node LN2; and a twelfth MOS transistor Q24 connected between the third node LN4 and the ground voltage VSS, wherein a gate of the twelfth MOS transistor Q24 receives an output of the second inverter IV13.

The data signal latch 233 includes a third and a fourth inverters IV14 and IV15 for latching the signal delivered to the third node LN4; and a fifth inverter IV16 for inverting an output of the third inverter IV14.

Figure 7:
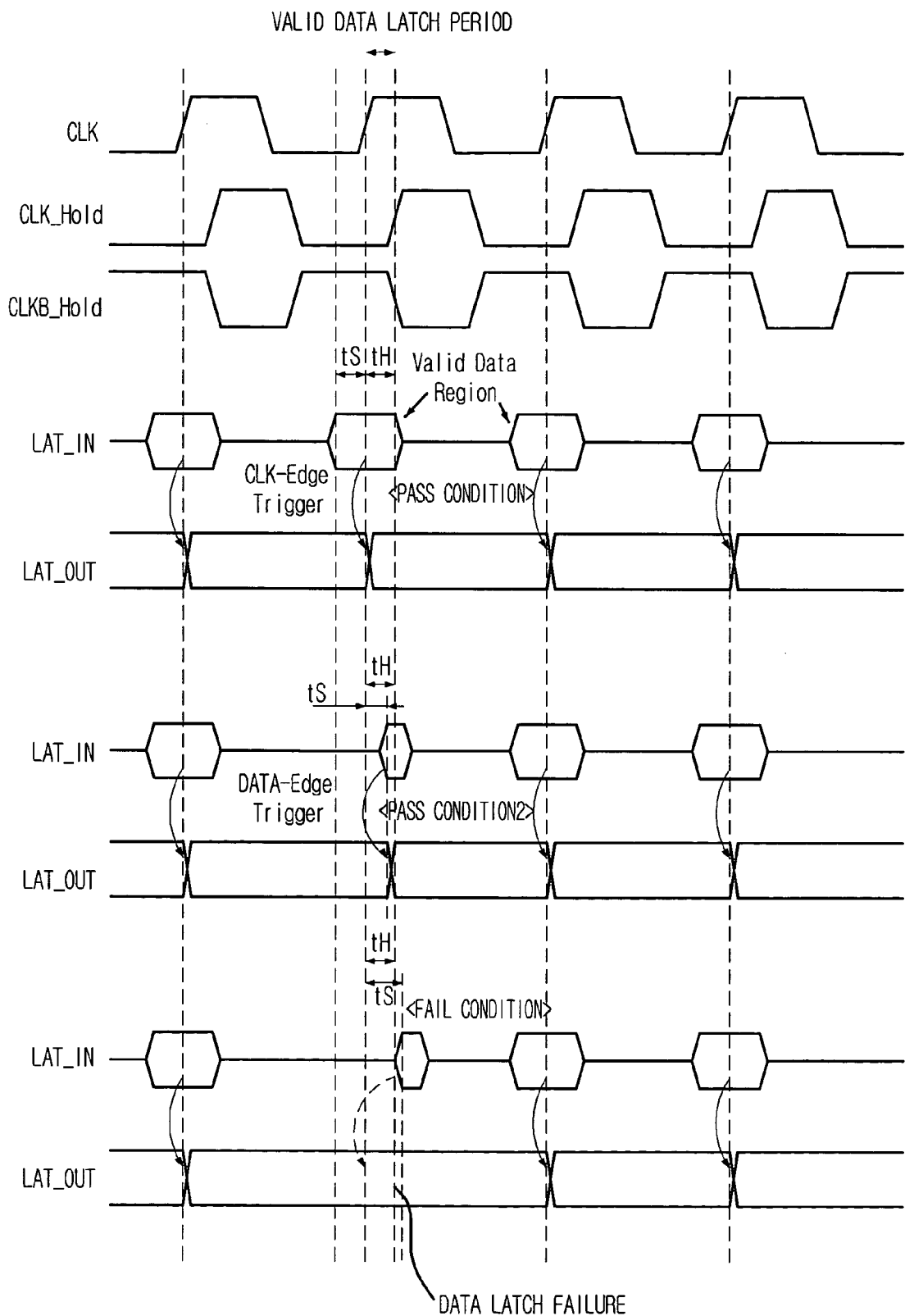
FIG. 7 is a wave diagram showing an operation of the data latch circuit shown in FIG. 4.

FIG. 7 is a wave diagram showing an operation of the data latch circuit shown in FIG. 4, particularly a pass condition and a fail condition of a data latch.

Referring to FIGS. 4 to 7, the operation of the data latch circuit is described below.

A distinguishing feature of the preferred embodiment of the present invention is that the first and the second data transition detection signals S and SB for receiving a data are generated by logically mixing the first clock signal delayed for the hold time, the second clock signal which is an inverted version of the first clock signal and a data signal so that the data latch operation is performed in response to the first and the second data transition detection signals S and SB.

If a data is normally inputted to the data latch circuit satisfying the set-up time tS and the hold time tH, the data signal LAT_IN is latched by the data latch circuit in synchronization with the first clock signal CLK_Hold or the second clock signal CLKB_Hold (pass condition 1 shown in FIG. 7).

Meanwhile, if the data is inputted later than a normal timing, i.e., the data is inputted after missing the set-up time and the hold time, an error surely occurs according to the prior art. However, in accordance with the preferred embodiment of the present invention, the abnormally inputted data can be correctly latched. That is, even though the data is inputted after missing the set-up time, a correct data latch is possible if the data in inputted within the hold time.

The first case (pass condition 1) shows that the data signal LAT_IN is normally inputted to the data latch circuit satisfying the set-up time and the hold time as above-mentioned.

The second case (pass condition 2) shows that the data signal LAT_IN is inputted to the data latch circuit after missing the set-up time but within the hold time. In this case, while the conventional data latch circuit fails to latch the data signal, the data latch circuit in accordance with the preferred embodiment of the present invention can successfully latch the data signal. This operation will be described in detail referring to FIGS. 9 and 10.

The third case (fail condition) shows the data signal LAT_IN missing both the set-up time and the hold time. In this case, the data signal LAT_IN fails to be latched.

Figure 8:
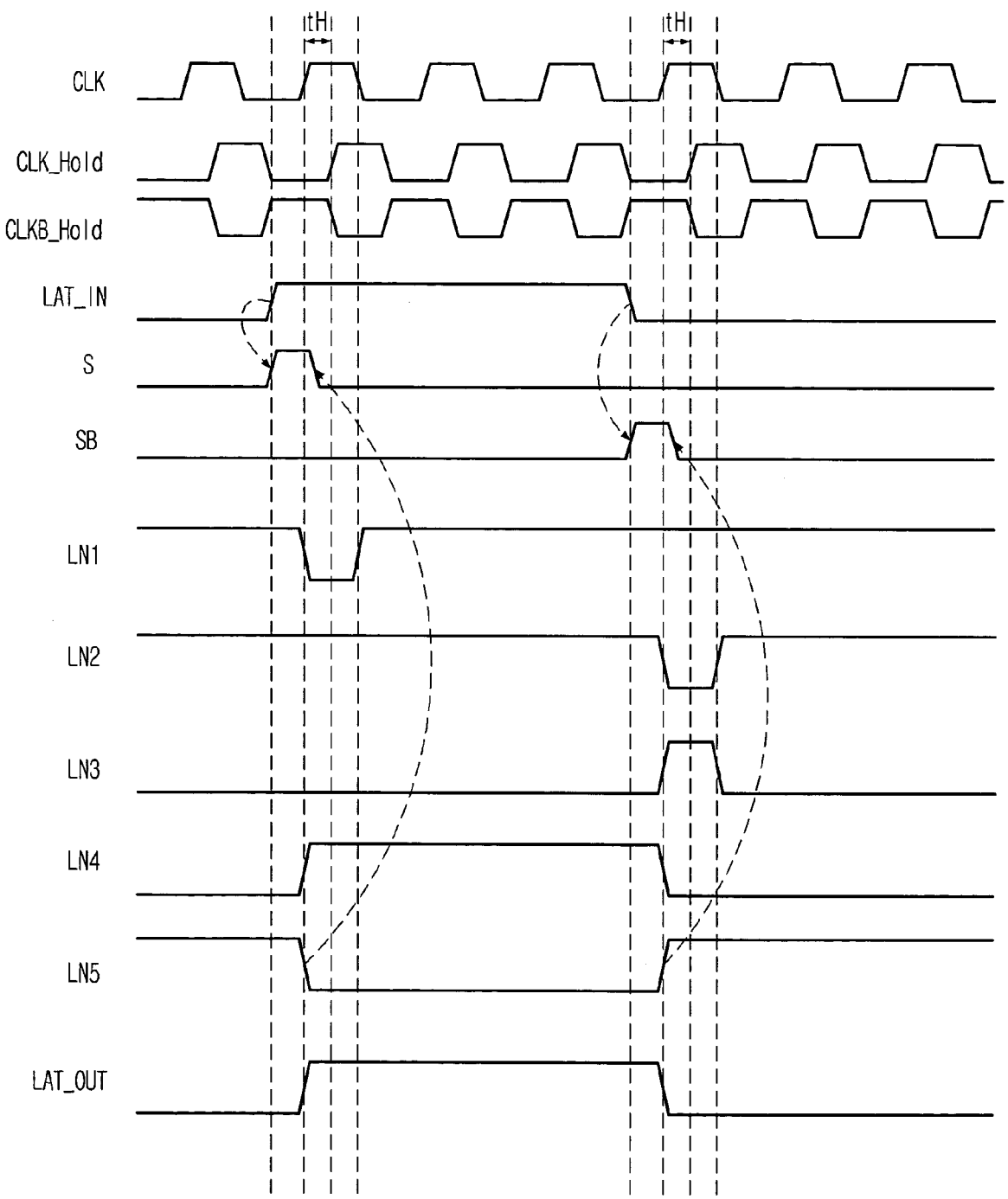
FIG. 8 is a wave diagram showing another operation of the data latch circuit shown in FIG. 4.

FIG. 8 is a wave diagram showing an operation of the data latch circuit shown in FIG. 4 when the set-up time of a data signal is prior to a data latch edge of the clock signal CLK and the hold time of the data signal is maintained for the hold time tH after the data latch edge of the clock signal CLK. That is, FIG. 8 shows the first case where the data signal LAT_IN is inputted at a normal timing.

Referring to FIG. 8, the operation of the data latch circuit is described below when a data is inputted at a normal timing.

Firstly, the hold time delay unit 2000 generates the first clock signal CLK_Hold by delaying the clock signal CLK for the hold time and also generates the second clock signal CLKB_Hold. Herein, the hold time delay unit 200 can use a plurality of inverters for delaying the clock signal CLK as shown in FIG. 5 or can use another circuit.

The data input control unit 100 receives the data signal LAT_IN and the first and the second clock signals CLK_Hold and CLKB_Hold in order to output the two signals S and SB to the data latch unit 200. According to a logic level of the data signal LAT_IN, one of the two signals S and SB is activated to be outputted as the first data transition detection signal. Herein, it is assumed that the inputted data signal LAT_IN is a high level data.

When a logic level of the data signal LAT_IN transitions to a high level, i.e., an input of the data signal LAT_IN begins, the first data transition detection signal S is outputted as a high level through the NAND gate ND1 and the first inverter IV12 by performing a logic operation to the second clock signal CLKB_Hold, the high level data signal LAT_IN and the feed-back signal FS which is in a high level. Herein, since a low level data is previously latched at the third node LN4, the feed-back signal FS is outputted as a high level.

Meanwhile, the precharge unit 210 is repeatedly enabled and disabled according to the clock signal CLK. When the clock signal CLK is in a low level, the precharge unit 210 is enabled to precharge the first and the second nodes LN1 and LN2 as a high level.

When the clock signal CLK is in a high level, the precharge unit 210 is disabled and the data storing unit 220 is enabled to discharge one of the first and the second nodes LN1 and LN2 in response to one, which has a high level, of the two signals S and SB. Herein, since the first data transition detection signal S is inputted as a high level, the first node LN1 is discharged and the second node LN2 maintains a high level.

Therefore, the pull-up unit 231 is enabled and, thus, the third node LN4 becomes a high level, whereby a latched high level data is inputted as an output data signal LAT_OUT. Also, the feed-back signal FS is outputted as a low level from the third inverter IV14 and, thus, the first data transition detection signal S is inactivated as a low level. Therefore, according to the feed-back signal FS, the first data transition detection signal S has a pulse form having a high level only for a predetermined time.

When the data transition detection signal S is inputted as a low level, the eighth MOS transistor Q20 is turned off and, thus, the first node LN1 is floated.

Thereafter, if the data signal LAT_IN transitions to a low level, i.e., the input of the data signal LAT_IN is finished, the second data transition detection signal SB is outputted as a high level through the NOR gate NOR1 by performing a logic operation to the first clock signal CLK_Hold, the low level data signal LAT_IN and the low level feed-back signal FS.

The data storing unit 220 discharges the charged second node LN2 in response to the high level second data transition detection signal SB. Since the second node LN2 becomes a low level, the output of the second inverter IV13 becomes a high level and, thus, the twelfth MOS transistor Q24 is turned off and the third node LN4 transitions to a low level. At this time, the first node LN1 is charged as a high level and the eleventh MOS transistor Q23 is turned off.

That is, a low level data is latched at the third node LN4, whereby the output data signal LAT_OUT is outputted as a low level. That means that the latching of the high level data is finished. Since the feed-back signal FS is outputted as a high level from the third inverter IV14, an output of the NOR gate NOR1, i.e., the second data transition detection signal SB is inactivated as a low level.

If the second data transition detection signal SB is inactivated as a low level, the ninth MOS transistor Q21 is turned off and, thus, the second node LN2 is floated.

As above-mentioned, during performing a latch operation of a high level data, the data latch circuit outputs the first and the second data transition detection signals S and SB as a high level pulse respectively at two transition timings of the data signal. Subsequently, the amplifying unit 221 is operated only during the high level pulses of the first and the second data transition detection signals S and SB. Therefore, even though the clock signal CLK is continuously inputted to the data storing unit 220, power is not consumed during the input of the data signal.

While the conventional data latch circuit unnecessarily consumes power during the input of the data signal due to the clocking of the clock signal CLK, the data latch circuit reduces power consumption since power is consumed only at the transitions of the data signal. The longer the input period of the data signal than a cycle of the clock signal CLK, the more power consumption is reduced.

Also, if data are continuously inputted at each clocking of the clock signal CLK, the data latch circuit also reduces power consumption when same data are continuously inputted.

That is, according to the prior art, for latching the inputted data at each clocking of the clock signal CLK, an operation of sensing and amplifying the inputted data is needed and, thus, even though the consecutively inputted data is at the same level, a current is consumed during each clocking of the clock signal CLK. However, in accordance with the preferred embodiment of the present invention, a current is consumed only at an initial transition of the consecutive same data. Therefore, a power consumption can be dramatically reduced in comparison with the conventional data latch circuit.

Figure 9:
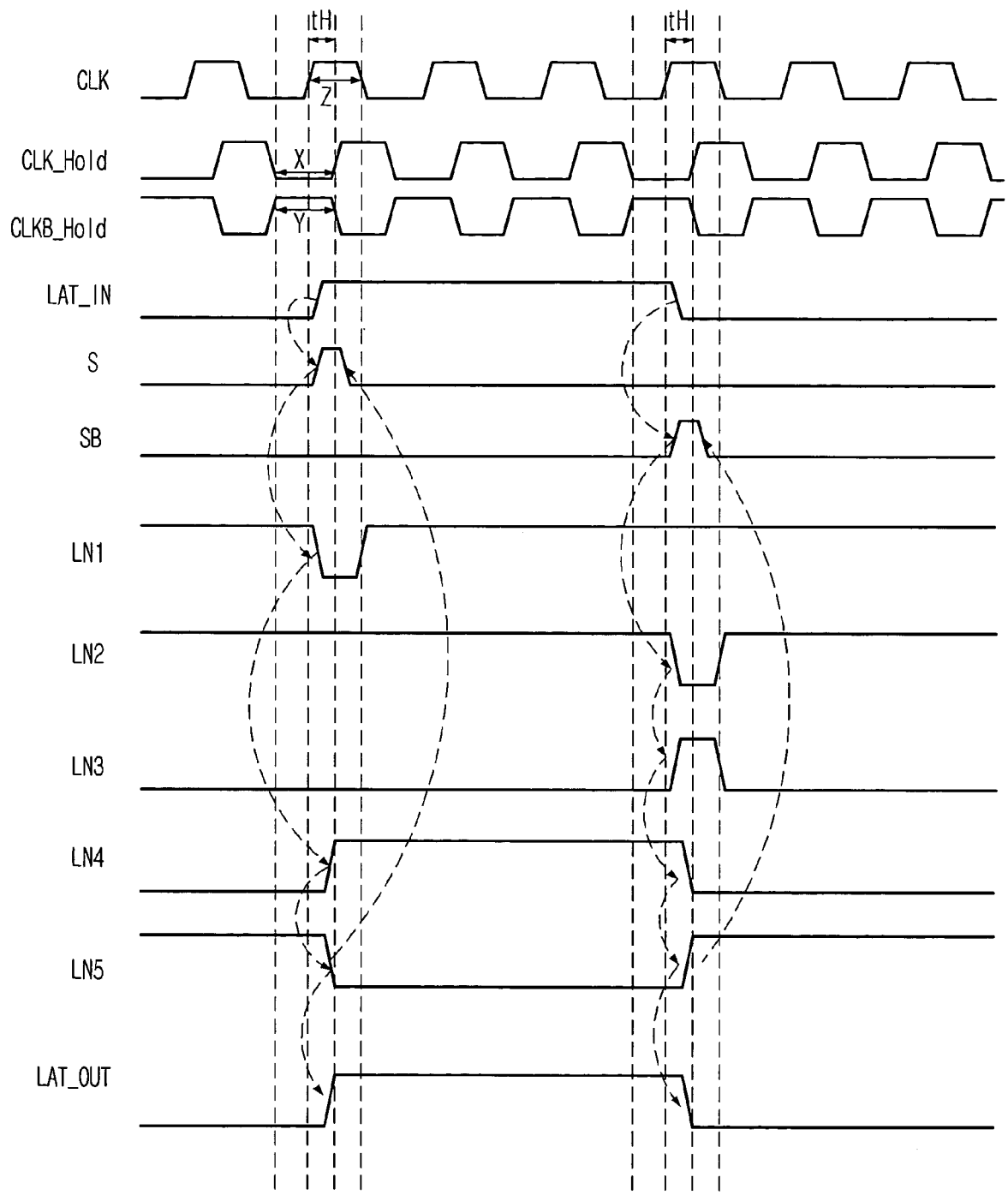
FIG. 9 is a wave diagram showing another operation of the data latch circuit shown in FIG. 4.

FIG. 9 is a wave diagram showing an operation of the data latch circuit shown in FIG. 4 when the set-up time of a data signal is behind the data latch edge of the clock signal CLK and the hold time of the data signal is maintained for the hold time tH after the data latch edge of the clock signal CLK. That is, the data signal misses the set-time and is inputted later than a desirable input timing.

Referring to FIG. 9, when the data signal is inputted later than the set-up time, the operation of the data latch circuit is described below.

As above-mentioned, even though the data signal is inputted later than the set-up time, the data latch circuit can normally latch the data signal. However, in this case, the data signal should be inputted before the hold time is passed.

The hold time delay unit 2000 generates the first clock signal CLK_Hold by delaying the clock signal CLK for the hold time and also generates the second clock signal CLKB_Hold.

The data input control unit 100 outputs one of the two signals S and SB as the first data transition detection signal and outputs the other of the two signals S and SB as the second data transition detection signal SB by performing a logic operation to the inputted data signal LAT_IN and the first and the second clock signals CLK_Hold and CLKB_Hold.

If the data signal LAT_IN is inputted as a high level, the first data transition detection signal (S) is activated as a high level and is inputted to the data latch unit 200. At this time, the feed-back signal FS is maintained as a high level.

Even though the data signal LAT_IN is not normally inputted at the data latch edge of the clock signal CLK, the first data transition detection signal can be normally activated as a high level because the data input control unit 100 receives the data signal LAT_IN by using the first and the second clock signals CLK_Hold and CLKB_Hold.

That is, since the data signal is inputted at a period where the first clock signal CLK_Hold is maintained at a low level (X, a period for receiving a low level data) or at a period where the second clock signal CLKB_Hold is maintained as a high level (Y, a period for receiving a high level data), even though the data signal is inputted later than the data latch edge of the clock signal CLK, the data transition detection signal can be normally changed to a high level.

If the first data transition detection signal S is inputted, the first node LN1 is amplified to a low level and the second node LN2 is amplified to a high level. Needless to say, since the first data transition detection signal S transitions to a high level at a period (Z) where the clock signal CLK is in a high level, the first and the second nodes LN1 and LN2 can be changed.

Since the first node LN1 is amplified to a low level and the second node LN2 is amplified to a high level, the eleventh MOS transistor Q23 included in the pull-up unit 231 is turned on and the twelfth MOS transistor Q24 included in the pull-down unit 232 is turned off. Accordingly, the third node LN4 transitions to a high level and, thus, a high level data is latched by the data signal latch 233 and the latched high level data is outputted.

Meanwhile, the low level feed-back signal FS is fed-back to the data input control unit 100 so that the data input control unit 100 inactivates the first data transition detection signal as a low level by using the feed-back signal FS.

Thereafter, if the inputting of the high level data is finished, i.e., if the high level data transitions to a low level, the data input control unit 100 activates the second data transition detection signal SB as a high level. In this case, since the input timing of the data signal is later than a normal input timing, the finishing timing is also later than a normal finishing timing. However, even in this case, since the data signal is received by using the first and the second clock signals CLK_Hold and CLKB_Hold, the second data transition detection signal SB can be changed to a high level.

If the second data transition detection signal SB is inputted as a high level, the second node LN2 becomes a low level. Accordingly, the twelfth MOS transistor Q24 is turned on and, thus, the third node LN4 transitions to a low level. Therefore, the data signal latch 233 latches a low level data and the latched low level data is outputted. That is, an output of the high level data is finished.

Meanwhile, the feed-back signal FS is outputted as a low level and the data input control unit 100 inactivates the second data transition detection signal SB.

As shown in FIG. 9, if the data signal is inputted after the set-up time, an activated pulse width of the first and the second data transition detection signals S and SB is narrower than that of the first and the second data transition detection signals S and SB shown in FIG. 8. However, since the data signal is inputted before the end of the hold time, the data signal can be normally latched.

Accordingly, the data latch circuit can stably latch a data signal if the data signal is inputted before the end of the hold time. Therefore, an operational margin can be greatly improved by applying the data latch circuit in accordance with the preferred embodiment of the present invention.

Figure 10:
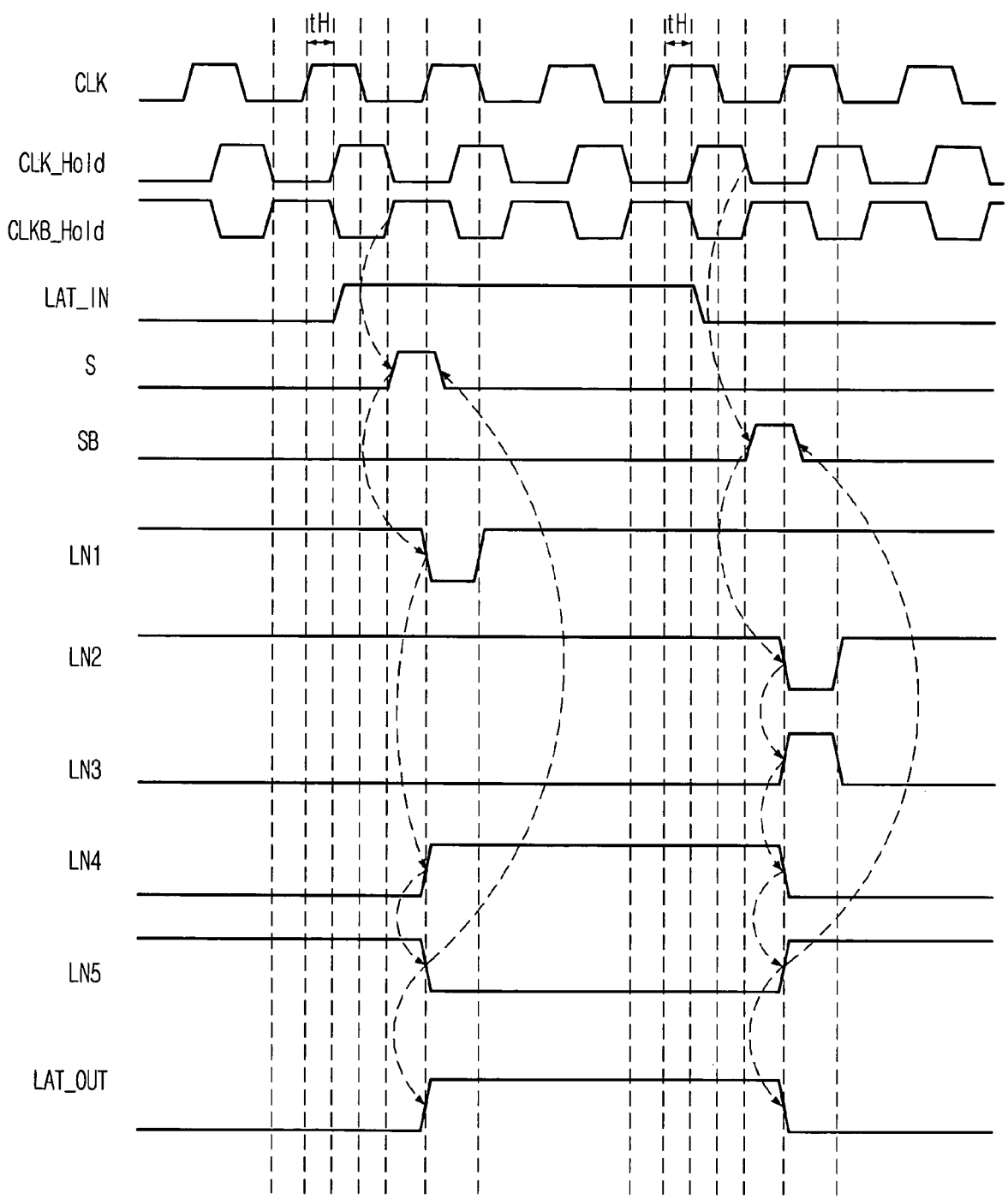
FIG. 10 is a wave diagram showing another operation of the data latch circuit shown in FIG. 4.

FIG. 10 is a wave diagram showing an operation of the data latch circuit shown in FIG. 4 if the set-up time of a data signal is behind the data latch edge of the clock signal CLK and is also behind the hold time.

That is, the data signal is inputted after the set-up time and the hold time. In this case, if the input of the data signal is maintained for a next clocking of the clock signal CLK, the data signal can be normally latched though there is one clock delay.

As above-mentioned, if a data signal is inputted after the set-up time and the hold time, the data signal fails to be latched. However, in the case shown in FIG. 10, since the input of the data signal is continuously maintained, the data signal can be normally latched though the latching is delayed by one clock.

The latching operation shown in FIG. 10 is very similar to the normal latching operation shown in FIG. 8. However, in case of the latching operations shown in FIG. 10, since the input of the data signal is delayed, each activation of the first and the second data transition detection signals S and SB is delayed by one clock.

In addition, if the normal latching operation, at the input timing of the data signal LAT_IN, the first and the second clock signals CLK_Hold and CLKB_Hold are already inputted to the data input control unit 100 and the data input control unit 100 activates the first data transition detection signal (S, SB) in response to the input of the data signal LAT_IN. On the contrary, for the latching operation shown in FIG. 10, after the input timing of the data signal LAT_IN, the first data transition detection signal (S, SB) is activated according to an input timing of the first clock signal CLK_Hold or the second clock signal CLKB_Hold.

In short, in accordance with the preferred embodiment of the present invention, a delay clock signal is generated by delaying a clock signal for a hold time; and during a first logic level of the delay clock signal, a data latch operation begins at a first transition timing of an inputted data signal; then, the data latch operation is finished at a second transition timing of the inputted data signal during a second logic level of the delay clock signal.

Therefore, even though the data signal misses the set-up time, the data signal can be normally latched if the data signal is inputted before the end of the hold time. Accordingly, an operational margin can be greatly improved.

Further, since the first and the second data transition detection signals S and SB are generated as a pulse signal, the above-mentioned unnecessary power consumption generated due to the clocking of the clock signal during the latching of the data signal can be prevented. Accordingly, in case that same level data are consecutively inputted or a data input period is longer than a clock cycle, a power consumption can be dramatically reduced.

The present application contains subject matter related to Korean patent application No. 2005-0027389, filed in the Korean Patent Office on Mar. 31, 2005, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. A data latch circuit for latching a data signal in synchronization with a clock signal, comprising:
a hold time delay unit for generating a first clock signal by delaying the clock signal for a hold time of the data signal and an inverse first clock signal as a second clock signal;
a data input control unit for generating a first data transition detection signal in response to the first clock signal and a first transition timing of the data signal and a second data transition detection signal in response to the second clock signal and a second transition timing of the data signal; and
a data latch unit for starting to latch the data signal in response to the first data transition detection signal and finishing the latching of the data signal in response to the second data transition detection signal.

2. The data latch circuit as recited in claim 1, wherein the hold time delay unit includes:
a delay unit for delaying the clock signal for the hold time of the data signal;
a buffering unit for buffering an output of the delay unit; and
an inverting unit for inverting the output of the delay unit.

3. The data latch circuit as recited in claim 2, wherein the delay unit includes two inverters connected in series.

4. The data latch circuit as recited in claim 3, wherein the buffering unit includes two inverters connected in series.

5. The data latch circuit as recited in claim 4, wherein the inverting unit includes an inverter for inverting the output of the delay unit.

6. The data latch circuit as recited in claim 1, wherein the data latch unit inactivates the first data transition detection signal in response to the start of latching the data signal and generates a feed-back signal for inactivating the second data transition detection signal in response to the finish of latching of the data signal.

7. The data latch circuit as recited in claim 6, wherein the data input control unit includes:
a first logic unit for performing a logic AND operation on the second clock signal, the data signal and the feed-back signal in order to generate the first data transition detection signal; and
a second logic unit for performing a logic NOR operation on the first clock signal, the data signal and the feed-back signal in order to generate the second data transition detection signal.

8. The data latch circuit as recited in claim 7, wherein the first logic unit includes:
a NAND gate for receiving the second clock signal, the data signal and the feed-back signal; and
an inverter for inverting an output of the NAND gate in order to generate the first data transition detection signal.

9. The data latch circuit as recited in claim 7, wherein the second logic unit includes a NOR gate for receiving the first clock signal, the data signal and the feed-back signal in order to generate the second data transition detection signal.

10. The data latch circuit as recited in claim 1, wherein the data latch unit includes:
a precharge unit for precharging a first and a second node in response to the clock signal;
a data storing unit for storing the data signal by discharging the first node or the second node in response to the first data transition detection signal and for resetting the stored data signal by discharging the charged node in response to the second data transition detection signal; and
a latch output unit for latching and outputting the data signal according to a charged/discharged state of the first and the second nodes.

11. The data latch circuit as recited in claim 10, wherein the data storing unit includes:
an amplifying unit for sensing and amplifying the first and the second nodes in a cross-coupled way;
a charge/discharge control unit for respectively discharging and charging the first and the second nodes in response to the first data transition detection signal and for respectively charging and discharging the first and the second nodes in response to the second data transition detection signal; and
a current delivering unit for sinking a current which is charged/discharged by the charge/discharged control unit in response to the clock signal.

12. The data latch circuit as recited in claim 10, wherein the latch output unit includes:
a pull-up unit for pulling-up a third node according to a voltage level of the first node;
a pull-down unit for pulling-down the third node according to a voltage level of the second node; and
a data signal latch for latching and outputting a signal delivered to the third node and for generating the feed-back signal for inactivating the first data transition detection signal or the second data transition detection signal by using the latched signal at the third node.

13. The data latch circuit as recited in claim 10, wherein the precharge unit includes:
a first MOS transistor for supplying a power supply voltage to the first node in response to the clock signal;
a second MOS transistor for supplying the power supply voltage to the second node in response to the clock signal; and a third MOS transistor for equalizing voltage levels of the first and the second nodes in response to the clock signal.

14. The data latch circuit as recited in claim 11, wherein the amplifying unit includes:
   a first MOS transistor whose gate and one terminal are respectively coupled to the first node and a power supply voltage;
   a second MOS transistor whose gate and one terminal are respectively coupled to the first node and the other terminal of the first MOS transistor;
   a third MOS transistor whose gate and one terminal are respectively coupled to the second node and the power supply voltage; and
   a fourth MOS transistor whose gate and one terminal are respectively coupled to the second node and the other terminal of the third MOS transistor.

15. The data latch circuit as recited in claim 14, wherein the charge/discharge control unit includes:
   a fifth MOS transistor whose one terminal is coupled to the other terminal of the fourth MOS transistor for discharging the first node in response to the first data transition detection signal; and
   a sixth MOS transistor whose one terminal is coupled to the other terminal of the second MOS transistor for discharging the second node in response to the second data transition detection signal.

16. The data latch circuit as recited in claim 15, wherein the current delivering unit includes a seventh MOS transistor connected between a ground voltage and the other terminals of the fifth and the sixth MOS transistors, wherein a gate of the seventh MOS transistor receives the clock signal.

17. The data latch circuit as recited in claim 12, wherein the pull-up unit includes a first MOS transistor connected between a power supply voltage and the third node, wherein a gate of the first MOS transistor is coupled to the first node.

18. The data latch circuit as recited in claim 17, wherein the pull-down unit includes:
   a first inverter for inverting a signal of the second node; and
   a second MOS transistor connected between the third node and a ground voltage, wherein a gate of the second MOS transistor receives an output of the first inverter.

19. The data latch circuit as recited in claim 18, wherein the data signal latch includes:
   a second and a third inverter whose inputs and outputs are crossly coupled for latching the signal of the third node; and
   a fourth inverter for inverting an output of the third inverter in order to output the inverted signal as a latched data,
   wherein an output of the second inverter is the feed-back signal.

20. A data latch circuit for latching a data signal in synchronization with a clock signal, comprising:
   a hold time delay unit for generating a delayed clock signal by delaying the clock signal for a hold time of the data signal;
   a data input control unit for generating a data input signal by receiving the data signal at an activation period of the delayed clock signal; and
   a data latch unit for latching a data signal which corresponds to the data input signal.

21. The data latch circuit as recited in claim 20, wherein the data latch unit generates a feed-back signal for inactivating the data input signal by using the latched data signal and inputs the feed-back signal to the data input control unit.

22. The data latch circuit as recited in claim 21, wherein the data latch unit includes:
   a transferring unit for transferring the data input signal;
   a sense amplifying unit for sensing and amplifying the data input signal transferred by the transferring unit;
   an output latch unit for latching and outputting the amplified data and for generating the feed-back signal by using the latched signal; and
   an enabling unit for enabling the transferring unit and the sense amplifying unit in response to the clock signal.

23. A method for latching a data signal in a semiconductor device, comprising the steps of:
   a) generating a delayed clock signal by delaying a clock signal for a hold time;
   b) starting to latch the data signal at a first transition timing of the data signal while the delayed clock signal is at a first level; and
   c) finishing the latch of the data signal at a second transition timing of the data signal while the delayed clock signal is at a second level.

24. The method as recited in claim 23, wherein the step of starting to latch includes the steps of:
   b-1) activating an input start signal which corresponds to the first transition timing of the data signal while the delayed clock signal is at the first level and outputting the activated input start signal;
   b-2) sensing a data signal delivered by the activated input start signal;
   b-3) amplifying the sense data signal; and
   b-4) latching and outputting the amplified data.

25. The method as recited in claim 24, further comprising the step of inactivating the input start signal by using the latched and outputted data signal.

26. The method as recited in claim 25, wherein the step of finishing includes the steps of:
   c-1) activating an input termination signal which corresponds to the second transition timing of the data signal while the delayed clock signal is at the second level and outputting the activated input termination signal;
   c-2) resetting the sensed and amplified data signal in response to the activated input termination signal; and
   c-3) terminating the output of the latched data signal in response to the resetting operation.

27. The method as recited in claim 26, further comprising the step of inactivating the input termination signal in response to the resetting operation.

* * * * *